United States Patent [19]
Miyasaka

[11] Patent Number: 5,389,580
[45] Date of Patent: Feb. 14, 1995

[54] THIN FILM SEMICONDUCTOR DEVICE AND METHOD OF PRODUCTION

[75] Inventor: Mitsutoshi Miyasaka, Suwa, Japan

[73] Assignee: Seiko Epson Corporation, Tokyo, Japan

[21] Appl. No.: 173,265

[22] Filed: Dec. 27, 1993

Related U.S. Application Data

[63] Continuation of Ser. No. 703,112, May 17, 1991, abandoned.

[30] Foreign Application Priority Data

May 18, 1990 [JP] Japan .................................. 2-128745
May 18, 1990 [JP] Japan .................................. 2-128746
Apr. 3, 1991 [JP] Japan .................................. 3-070879

[51] Int. Cl.$^6$ ............................................. H01L 21/469
[52] U.S. Cl. ......................................... 437/233; 437/40; 437/93; 437/4; 148/DIG. 150
[58] Field of Search .................. 437/233, 93, 40, 4; 148/DIG. 150

[56] References Cited

U.S. PATENT DOCUMENTS

| | | | |
|---|---|---|---|
| 4,900,694 | 2/1990 | Nakagawa | 437/233 |
| 5,026,574 | 6/1991 | Economu et al. | 437/233 |
| 5,064,779 | 11/1991 | Hasegawa | 437/233 |

OTHER PUBLICATIONS

Meakin et al.; "The Growth of polycrystalline silicon films by low pressure chemical vapour deposition at relatively low temperature"; Thin Solid Film, 163 (1988) 249–254.

Loisel et al; "LPCVD Silicon For Active Devices"; Journal De Physique Colloque C5; pp. 467–477, May 1989.

Ahmed et al.; "The growth of polycrystalline silicon by ultra low pressure chemical vapour deposition"; Proceedings of the Tenth International Conference on Chemical Vapor Deposition 1987; pp. 445–456.

Meakin, et al, "High-performance thin-film transistors from optimized polycrystalline silicon films", Applied Physics Letters, vol. 50, No. 26, Jun. 1987, pp. 1894–1896.

Mimura, et al, "High performance low-temperature poly-si n-channel TFT's for LCD", IEEE Transactions on Electron Devices, vol. 36 No. 2, Feb. 1989, pp. 351–359.

Czubatyj, et al, "Low-temperature polycrystalline-silicone TFT on 7059 glass", IEEE Electron Device Letters, vol. 10 No. 8, Aug. 1989, pp. 349–351.

Tsu, et al, "Critical volume fraction of crystallinity for conductivity percolation in phosphorus-doped Si:F:H alloys", Applied Physics Letters, vol. 40, No. 6, Mar. 15 1982, pp. 534–535.

Hatalis, et al., "Large grain polycrystalline silicon by low-temperature annealing of low-pressure chemical vapor deposited amorphous silicon films", Journal of Applied Physics, vol. 63 No. 7, Apr. 1988, pp. 2260–2266.

Migliorato and Meakin, "Material Properties and Char. of Poly-Si Transistors", Applied Surface Science, pp. 353–371 (1987).

Meakin, et al., "Low Defect Polycrystalline Si", Applied Surface Science, pp. 372–382 (1987).

Kung and Reif, "Poly-Si Thin Film Transistors", J. Appl. Phys. 62 (4), 15 Aug. 1987, pp. 1503–1509.

Aoyama, et al., "Crystallization of LPCVD Si Films", J. Electrochem. Soc. vol. 136, No. 4, Apr. 1989, pp. 1169–1173.

Primary Examiner—Brian E. Hearn
Assistant Examiner—Trung Dang
Attorney, Agent, or Firm—Stroock & Stroock & Lavan

[57] ABSTRACT

A thin film semiconductor device having a silicon thin film semiconductor layer deposited on an ordinary glass substrate at low temperatures of not over 600° C. The silicon film has at least about a 40% degree of crystallinity and mainly {111} preferred orientation. The thin film can be formed by a low pressure chemical vapor deposition process using monosilane (SiH$_4$) as a source gas at a total reactor pressure of about 15 mTorr or less or at a silane partial pressure of about 10 mTorr or less at a vapor phase deposition temperature of not more than about 600° C.

10 Claims, 5 Drawing Sheets

THIN FILM SEMICONDUCTOR DEVICE AND METHOD OF PRODUCTION

This is a continuation of application Ser. No. 07/703,112, filed May 17, 1991 for THIN FILM SEMICONDUCTOR DEVICE AND METHOD OF PRODUCTION, now abandoned.

BACKGROUND OF THE INVENTION

The invention relates generally to a thin film semiconductor device and more particularly to a device including an active silicon thin film having particularly desirable characteristics for use in a thin film transistor that can be included as an active element in a liquid crystal display device.

It is becoming important to construct liquid crystal displays having a large screen size and high resolution so that a large volume of information can be displayed. Consequently, it is becoming important to improve systems for driving the display in order to maintain acceptable display quality. This has led to wide spread use of active matrix display systems that include a switching transistor at each picture element (pixel) of the display. This allows high quality liquid crystal displays to be formed with hundreds of thousands of picture elements.

Conventional active matrix displays are constructed with transparent substrates and a matrix of switching transistors, such as thin film transistors, on the substrate. Transparent insulating substrates for transparent displays include melt quartz plates, glass plates and the like. It is desirable to form the transparent substrate from low cost ordinary glass in order to increase the size of a liquid crystal display screen without undesirably increasing the cost of the screen, or when it is desired to reduce the cost of a screen without decreasing its size. However, conventional techniques for forming acceptable quality thin film transistors on an ordinary glass substrate to form a liquid crystal active matrix display having suitable properties have been unsatisfactory.

Amorphous silicon and polycrystalline silicon are commonly used for forming an active semiconductor layer for a thin film transistor. Polycrystalline silicon which exhibits high operating speed is useful for forming a thin film transistor which has a driving circuit formed integrally therewith. However, in order to form a silicon thin film on an ordinary glass substrate, the silicon film must be formed at a low temperature of about 600° C. or less. A technique for accomplishing this would be extremely useful and can also be applied to integration of SRAM's or the like and formation of multi-layer LSI's.

One attempt at forming a high quality silicon thin film at a low temperature is low pressure chemical vapor deposition (LPCVD). However, conventional LPCVD processes can only form silicon thin films having unsuitable quality. For example, such films tend to have unsuitably low crystallinity and as well as mainly {220} preferred orientation when deposited at 600° C. or less. Such low pressure CVD polycrystalline silicon thin films are unsuitable for many semiconductor devices.

Improved silicon thin films have been formed by depositing the thin film at as high a deposition temperature as possible (610° to 640° C.) and at a deposition pressure of 40 mTorr to 750 mTorr. Such a method is discussed in Appl. Phys. Lett., 50(26), p. 1894 (1987).

Another method involves depositing a silicon film on an insulating substrate by low pressure CVD at a temperature of 570° C. or less and then heating the film to a temperature of about 640° C. or less for 24 hours to change the orientation and crystallinity of the film. This method is discussed in Japanese Patent Laid Open No. 63-307776. Another example of a method of forming improved thin films is to deposit an amorphous silicon thin film at a temperature of about 300° C. or less by an RF magnetron sputtering process or by a plasma CVD process and then apply laser beams to the film. Such a method is discussed in Jpn. J. Appl. Phys., 28, p. 1871 (1989) and in Technical Research Report of the Society of Electron Information Communication EID-88-58.

Despite having some advantages, the aforementioned processes have not proved to be fully satisfactory. Heating the thin film or applying laser beams to the film adds complicated and tedious production steps compared to low pressure CVD. This reduces productivity and necessitates purchasing expensive processing equipment and increases production costs.

The principal drawback of depositing an acceptable quality silicon thin film to serve as an active layer of a semiconductor device by conventional low pressure CVD is that the deposition temperature is too high. For example, if a thin film device is to be formed on a low-cost glass substrate, the highest permissible temperature for the production process is about 600° C. Furthermore, the substrate can only be kept at that temperature for several hours. In addition, when a thin film semiconductor device is used for a three dimensional LSI, SRAM or the like, it is beneficial to produce the semiconductor device at 600° C. or less to protect lower layer transistors and connections. However, conventional low pressure CVD forms silicon thin films having undesirably low crystallinity and having mainly {220} preferred orientation. Polycrystalline silicon thin films formed by conventional low pressure CVD are not suitable for active layers of semiconductor devices. Thus, they should not be used as switching elements for liquid active matrix crystal displays, nor should they be used for three dimensional LSI's, SRAM's and the like.

Accordingly, it is desirable to provide a high quality silicon thin film for a thin film switching device which overcomes the inadequacies of the prior art.

SUMMARY OF THE INVENTION

Generally speaking, in accordance with the invention, a thin film semiconductor device including a silicon thin film semiconductor layer deposited on an ordinary glass substrate at low temperatures of not over about 600° C. is provided. The thin film has at least a 40% degree of crystallinity and mainly {111} preferred orientation. The thin film can be formed by a low pressure chemical vapor deposition process using monosilane ($SiH_4$) as a source gas at a total reactor pressure of about 15 mTorr or less or at a silane partial pressure of about 10 mTorr or less at a vapor phase deposition temperature of not more than about 600° C.

Accordingly, it is an object of the invention to provide an improved silicon thin film and thin film semiconductor device.

Another object of the invention is to improve the properties of silicon thin films produced by low pressure CVD at temperatures below about 600° C.

A further object of the invention is to provide a thin film semiconductor device with an active layer fabricated by low pressure CVD at temperatures below about 600° C.

Still other objects and advantages of the invention will in part be obvious and will in part be apparent from the specification and drawings.

The invention accordingly comprises the several steps and the relation of one or more of such steps with respect to each of the others, and the device possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1A:
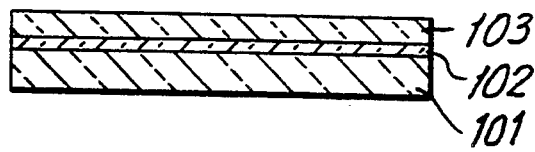
FIGS. 1A, 1B, 1C, 1D, 1E and 1F are cross-sectional views illustrating steps of forming a silicon thin film transistor semiconductor device in accordance with the invention.

A thin film semiconductor device in accordance with the invention includes a silicon thin film active layer formed on a substrate. The substrate can be formed of transparent ordinary glass because the silicon thin film is not formed at excessively high temperatures. However, the thin film can still have excellent properties and can be formed with at least a 40% degree of crystallinity and mainly {111} preferred orientation.

A thin film prepared in accordance with the invention is formed by a low pressure chemical vapor deposition (LPCVD) process using monosilane (SiH$_4$) as a source gas. The total reactor pressure should be about 15 mTorr or less or a silane partial pressure should be about 10 mTorr or less at a vapor phase deposition temperature of about 600° C. or less.

A thin film device in accordance with the invention can include a substrate having at least one surface covered with an insulating material and a silicon thin film semiconductor layer formed on the insulating material layer. The semiconductor layer preferably includes a silicon thin film having appropriate qualities for use in a thin film transistor. Such a silicon material can be characterized as having a refractive index of 4.06 or less for light having a wavelength of 589.3 nm in air. The silicon thin film can also be characterized as having a refractive index of 4.46 or more for light having a wavelength of 308 nm in air or as having an extinction index of 0.81 or less for light having a wavelength of 407.7 nm. Alternatively, a suitable silicon thin film in accordance with the invention can be characterized as having a degree of crystallinity of 40% or more, when measured by Raman spectroscopy.

When silicon thin films are formed in accordance with the low pressure CVD process, the resulting film has excellent properties even though it is formed at a low temperature of 600° C. or less. The film properties such as crystallinity, preferred orientation and optical properties are better than those of conventional silicon thin films formed at low temperatures and the thin film can be used as an active layer for a thin film semiconductor device having characteristics that are superior to those of conventional devices.

FIGS. 1A through 1F illustrate the steps of forming a polycrystalline silicon thin film transistor for an MIS-type field effect transistor (MISFET). A glass substrate 101 was covered with a protective underlayer film 102 of silicon dioxide and a silicon thin film 103 was disposed thereon. Common substrate materials, such as ordinary glass or quartz glass which can withstand a temperature of about 600° C. can be employed, regardless of type or size. For example, a three dimensional LSI formed on a silicon wafer can be used as the substrate. Alternatively, a ceramic substrate such as a sintered alumina substrate (Al$_2$O$_3$) an aluminum nitride substrate (AlN), a silicon carbide substrate (SiC), a graphite substrate or the like or a plate of a high melting point metal such as tungsten, molybdenum or the like can also be used as substrate 101.

A quartz glass substrate should be immersed in a nitric acid solution, boiled for a few minutes, then washed, such as in pure water in which nitrogen gas is bubbled. When a metal substrate is used, it is not necessary to wash the substrate with nitric acid if the substrate will be eroded or deteriorated by the acid. Other effective methods of washing a substrate include washing with an organic solvent such as acetone or methyl ethyl ketone (MEK) or the like, followed by ethanol washing and then a pure water washing. Alternatively, the substrate can be washed with an aqueous solution containing an organic surfactant or a silicon containing surfactant, followed by washing with pure water.

Protective underlayer film 102 of silicon dioxide is disposed on the washed quartz substrate by an acceptable method such as atmospheric pressure chemical vapor deposition (APCVD). Underlayer 102 is useful for stabilizing the properties of an active silicon thin film deposited thereon. Protective underlayer 102 also helps prevent movable ions, such as sodium ions and the like present in conventional glass or ions present in a sintering assistant material added to ceramic plate substrates, from diffusing and mixing into the transistor portion of the device. Underlayer film 102 can also insulate the transistor portion from a metal plate substrate. When constructing a three dimensional LSI element, protective underlayer film 102 will correspond to an interlayer insulating film between transistors or between connections.

Silicon thin film 103 containing either donor or acceptor impurities is then deposited on underlayer film 102 by a low pressure CVD process in accordance with the invention. A source region and a drain region 104 of a thin film transistor (TFT) are formed in thin film 103 by etching. Silicon thin film 103 can be formed with phosphorus impurities to yield an n-type transistor. In fact, any other Group V or VI element can be added as an n-type impurity. Alternatively, Group II or III elements, such as boron and the like can be added as impurities to yield a p-type transistor.

Impurities can be added to a silicon thin film by various methods such as the CVD method. Thin film 103 can also be formed by disposing an intrinsic silicon thin film containing no impurities and then adding impurities by diffusing the impurities from a vapor phase or a solid phase in contact with the silicon thin film. Thin film 103 can also be doped by implanting ions of the impurity into the intrinsic silicon thin film.

By forming an intrinsic silicon thin film and then diffusing or implanting impurities, the impurities can be selectively added only to desired portions of the thin film. This is useful for producing a self-aligned transistor having a gate electrode terminal and a source terminal or a drain terminal in self-alignment. This also enables the formation of a silicon thin film having portions containing impurities at different concentrations and thus having different current densities and specific resistances. This makes it possible to cause a current to flow only through a desired portion of the silicon thin film.

For example, phosphorus impurities were deposited in a silicon thin film to a thickness of 1500 Å by using a gas containing phosphine ($PH_3$) and silane. During deposition, monosilane at 200 SCCM, helium-phosphine mixture gas at 6 SCCM containing 99.5% helium and 0.5% phosphine and helium at 100 SCCM were passed through a low pressure CVD reactor having a volume of 184.5 liters at a deposition temperature of 600° C. The pressure in the reactor was 100 mTorr. The deposition rate was 29.6 Å/min and the sheet resistance immediately after the formation of the film was 2025 Ω/square.

Figure 1B:
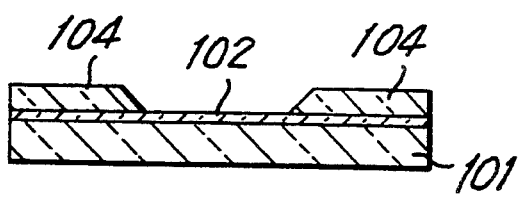

A resist layer can be formed on the silicon thin film 103 which can be patterned such as by using a plasma mixture containing carbon tetrafluoride ($CF_4$) and oxygen ($O_2$) to form source/drain region 104 as shown in FIG. 1B. Substrate 101 can then be washed to remove impurities such as residual resist and the like such as by immersion in boiling nitric acid for 5 minutes. The natural oxide film on source/drain regions 104 can be removed such as by immersion in a 1.67% hydrofluoric acid solution for 20 seconds.

Figure 1C:
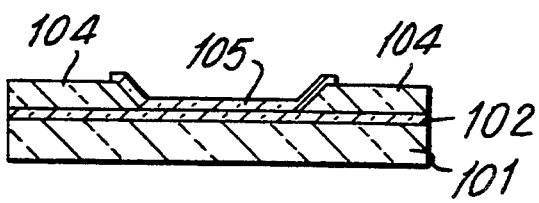

A silicon film 105 to serve as a channel portion as shown in FIG. 1C was then immediately formed on the substrate by a low pressure CVD process, in accordance with the invention. Silicon film 105 should be less than about 1500 Å thick preferably less than 1400 Å thick and most preferably less than about 1370 Å thick. substrates can be placed horizontally near the center of a reactor. The source gas as well as optional dilution gas which can be helium, nitrogen, argon, hydrogen or the like can be introduced into the reactor at a lower portion and exhausted through an upper region. A three zone heater can be positioned outside the reactor so that an isothermal zone at a selected temperature can be formed at substantially the center of the reactor by adjusting separately the three zones.

An isothermal zone having a height of about 350 mm and temperature deviation of 0.2° C. or less can be established when the temperature is set at 600° C. Accordingly, if the spacing between substrates inserted into the reactor is 10 mm, 35 substrates can be treated during one batch process.

The pressure conditions in the reactor during silicon deposition are important for obtaining silicon having desirable. properties and is related to the gas flow rate through the reactor. The reactor should have a gas pumping speed of over about 1.5 SCCM/mTorr, more preferably over about 1.7 SCCM/mTorr and even more preferably above 1.78 SCCM/mTorr.

After insertion of the substrate, the reactor can be evacuated to a low pressure with a rotary pump as well as a mechanical booster pump which can be connected in series. Silane should be pumped at over 1.5 SCCM/mTorr, preferably over 1.7 SCCM/mTorr and more preferably over 1.78 SCCM/mTorr. For example, when both pumps were operated in a 184.5 liter reactor with a reactor temperature of 600° C. and helium flowing at 9 SCCM, the equilibrium pressure in the reactor was 5.05 mTorr. Thus, the pumping speed of the source gas through the reactor was more than 1.78 SCCM/mTorr. When helium was flowing at 74 SCCM, the equilibrium pressure was 25.20 mTorr.

The equilibrium pressure in the reactor changes substantially linearly with the flow rate between the above two flow rate values. However, the change will deviate from a linear relationship over a wide flow rate range. For example, when the pumps were operated in the 184.5 liter reactor at 600° C., the equilibrium pressure for helium flowing at 200 SCCM was 56.56 mTorr. and the pressure was 186.04 mTorr when helium flowed at 1 SLM. Although the equilibrium pressure changes linearly between flow rates of 200 SCCM and 1 SLM, the pressure dependence on the flow rate is different from that of the flow rate range between 9 SCCM and 74 SCCM. Pressure in the reactor was measured by a capacitance manometer which does not depend on the type of gas measured.

Substrate 101 having source/drain regions 104 with no natural oxide film thereon is next inserted into the low pressure CVD reactor with the top surface facing downwards, for example. During insertion, the temperature in the reactor can be between 395° C. and 400° C. and the inside of the reactor can be maintained in a nitrogen atmosphere. A nitrogen curtain can be formed near the inlet of the reactor by flowing nitrogen at about 6 SLM to minimize the flow of air into the reactor when the substrates are inserted.

After the substrates are inserted into the reactor, the reactor is evacuated and can be tested for leakage. If no abnormalities are detected, the temperature in the reactor can be increased from the insertion temperature of about 400° C. to the deposition temperature. Silicon thin film 105 can be deposited at a temperature of about 600° C. and still possess acceptable properties. It required 1 hour for the 184.5 liter reactor to increase the reaction temperature to this level. If the deposit temperature is to be 630° C., it would take about 1 hour and 30 minutes to reach this level. It would take about 35 minutes to reach a temperature of 550° C.

As the temperature is increasing, the two vacuum pumps are operated and inert gas or reducing gas having a purity of at least 99.99% should flow continuously into the reactor. Examples of such inert or reducing gas include hydrogen, helium, nitrogen, neon, argon, xenon, krypton and the like as well as mixtures thereof. When helium with a 99.9999% purity or higher flowed continuously at 350 SCCM, the total pressure of the 184.5 liter reactor could be kept at 80.8±1.3 mtorr with a confidence level of 95%.

After the deposition temperature is reached, silicon thin film 105 is deposited by using a predetermined amount of silane gas or a gas mixture containing silane and a dilution gas which are introduced as a source gas into the reactor. The dilution gas can be the same gas that is passed through the reactor during temperature rise. The purity of each gas is preferably 99.999% or higher. A silicon thin film was deposited by flowing silane having a purity of over 99.999% at 10 SCCM, without using dilution gas in the 184.5 liter reactor. During deposition, the total pressure in the reactor was 8.54 mTorr.

The pressure in the reactor is the sum of the partial pressures of the gases, i.e., the partial pressure of silane which is the source gas and the partial pressure of hydrogen which is the reaction product plus the partial pressure of any inert gas present. The partial pressure of hydrogen reaction product gas cannot be determined precisely. The partial pressure can be calculated from the equilibrium pressure in the reactor when inert helium gas flows at 10 SCCM under identical conditions. For the 184.5 liter reactor, the partial pressure of silane estimated by this method was 5.4 mTorr. And a silicon thin film channel portion was deposited to a thickness of 250 Å at a deposition rate of 14.27 Å per minute.

Silicon thin film 105 can be patterned with resist and etched with a plasma mixture containing carbon tetrafluoride and oxygen to form channel portion silicon thin film 105 as shown in FIG. 1C. The deposited silicon thin film can be etched with a vacuum plasma of 15 Pa containing $CF_4$ and $O_2$ in a ratio of 50 SCCM:100 SCCM with the power of 700 W at an etching rate of 7.6 Å per second. The substrate can be washed with 96% sulfuric acid at 97° C. for 20 minutes and immersed in boiling 60% nitric acid for 30 minutes.

Figure 1D:
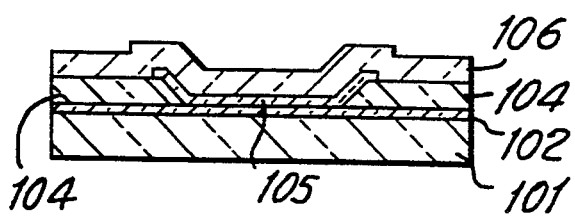

A gate insulating film 106, shown in FIG. 1D can be deposited over channel portion 105 by an APCVD process. Gate insulating film 106 of a 1500 Å thick $SiO_2$ film can be formed by passing a nitrogen/silane gas mixture containing 20% silane at 300 SCCM and oxygen at 420 SCCM at a temperature of 300° C. and a deposition rate of 1.85 Å per second. The refractive index of such a film was 1.455 for light having a wavelength of 6328 Å. If the film was etched with an aqueous 1.67% hydrofluoric acid solution at 25° C. the etching speed would be 21.3 Å per second. Etching takes place when contact holes are opened.

Figure 1E:
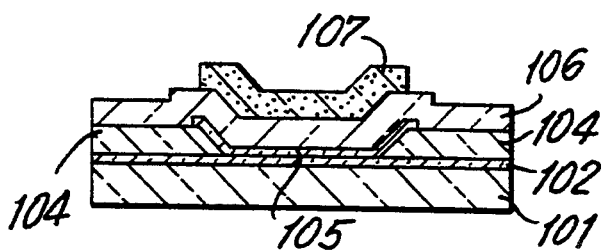

A thin film gate electrode 107, shown in FIG. 1E, can then be deposited such as by sputtering, evaporation or a CVD process or the like. For example a 2000 Å thick indium tin oxide (ITO) gate electrode can be deposited by sputtering. Gate electrode 107 can be formed of a metal material such as aluminum, chromium and the like, a conductive metal oxide such as indium tin oxide, a silicon film and a silicon metal compound. After gate electrode 107 is formed, a contact hole is opened in gate insulating film 106 and source and drain takeoff electrodes 108 are formed, such as by sputtering, to complete formation of a thin film transistor 100 shown in FIG. 1F.

Silicon thin films and methods of formation, in accordance with the invention, will be described below, with reference to the following examples. The examples are presented for purposes of illustration only, and are not intended to be construed in a limiting sense.

EXAMPLE 1

A 235 mm² quartz glass substrate 101 was immersed in 60% nitric acid and boiled for 5 minutes, then washed in pure water in which nitrogen gas bubbled. A 2000 Å thick silicon dioxide film was deposited on substrate 101 to form protective underlayer film 102 by an atmospheric pressure chemical vapor deposition (APCVD) process and the temperature of substrate 101 was 300° C. 20% silane diluted with nitrogen was used at a flow of 600 SCCM together with oxygen at 840 SCCM to provide a deposition rate of 3.9 Å per second.

A 1500 Å thick silicon thin film 103 containing phosphorus impurities was deposited on underlayer 102 by using monosilane at 200 SCCM, helium-phosphine mixture gas at 6 SCCM containing 99.5% helium and 0.5% phosphine at 6 SCCM and helium at 100 SCCM were passed through a low pressure CVD reactor having a volume of 184.5 liters. The deposition temperature was 600° C. and the reactor pressure was 100 mTorr to yield a deposition rate of 29.6 Å per minute. The sheet resistance of the silicon thin film immediately after formation was 2,025 Ω/□.

A resist was formed on silicon thin film 103 which was then patterned using a plasma mixture containing $CF_4$ and oxygen to form source/drain regions 104. Impurities such as residual resist and the like were removed by washing by immersion in boiling nitric acid for 5 minutes and the natural oxide film on the source/drain regions 104 was removed by immersion in a 1.67% hydrofluoric acid solution for 20 seconds.

Immediately after washing, a silicon thin film to serve as channel portion 105 was formed by a low pressure CVD process in accordance with the invention. The substrate shown in FIG. 1B was inserted into a 184.5 liter LPCVD reactor with source/drain regions 104 facing downwards. A heater divided into three zones was positioned outside the reactor so that an isothermal zone about 350mm thick having a temperature deviation of less than about 0.2° C. could be formed within the reactor. Seventeen substrates were placed into the isothermal zone at 20 mm intervals.

The temperature of the reactor was maintained between 395° C. and 400° C. when the substrates were inserted. A nitrogen curtain was formed near the inlet of the reactor using nitrogen at about 6 SLM to minimize the flow of air into the reactor during insertion. The temperature of the reactor was then increased to 600° C. and this took 1 hour. During temperature increase, helium having a purity of 99.9999% flowed continuously at 350 SCCM and the pressure in the reactor was 80.95 mTorr. The reactor was evacuated using a rotary pump and a mechanical booster pump which were connected in series. At 600° C., the equilibrium pressure in the reactor was 5.05 mTorr when helium flowed into the reactor at 9 SCCM and 25.20 mTorr when helium flowed at 74 SCCM.

After the 600° C. deposition temperature was reached, the silicon thin film was deposited using silane having a purity of over 99,999% at 10 SCCM, without any dilution gas. The total pressure in the reactor during deposition was 8.54 mTorr. The partial pressure of silane was estimated to be about 5.4 mTorr and a 250 Å thick silicon thin film was formed at a deposition rate of 14.27 Å per minute.

Silicon thin film 105 was then patterned using a resist and etched by using a vacuum plasma of 15 Pa containing carbon tetrafluoride and oxygen in a ratio of 50 SCCM:100 SCCM with a power of 700 W at an etching rate of 7.6 Å per second. The substrate was washed with 96% sulfuric acid at 97° C. for 20 minutes and immersed in boiling 60% nitric acid for 30 minutes.

A 1500 Å thick silicon dioxide film was deposited thereon by passing a nitrogen/silane gas mixture containing 20% silane at 300 SCCM and oxygen at 420 SCCM at a substrate temperature of 300° C. The deposition rate was 1.85 Å per second. The refractive index of the film formed was 1.455 for light of a wavelength of 6328 Å.

Figure 1F:
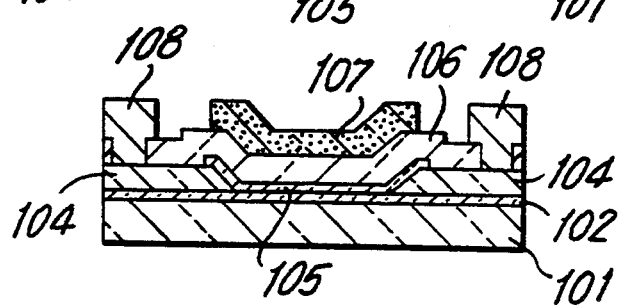

A 2000 Å thick indium tin oxide (ITO) gate electrode 107 was then deposited by sputtering. Thereafter, contact holes were opened in gate insulating film 106 and source/drain electrode terminals 108 as shown in FIG. 1F were formed by sputtering to complete transistor 100. The film was etched with an aqueous solution of 1.67% hydrofluoric acid at 25° C. at an etching speed of 21.5 Å per second when the contact holes were opened.

Figure 2:
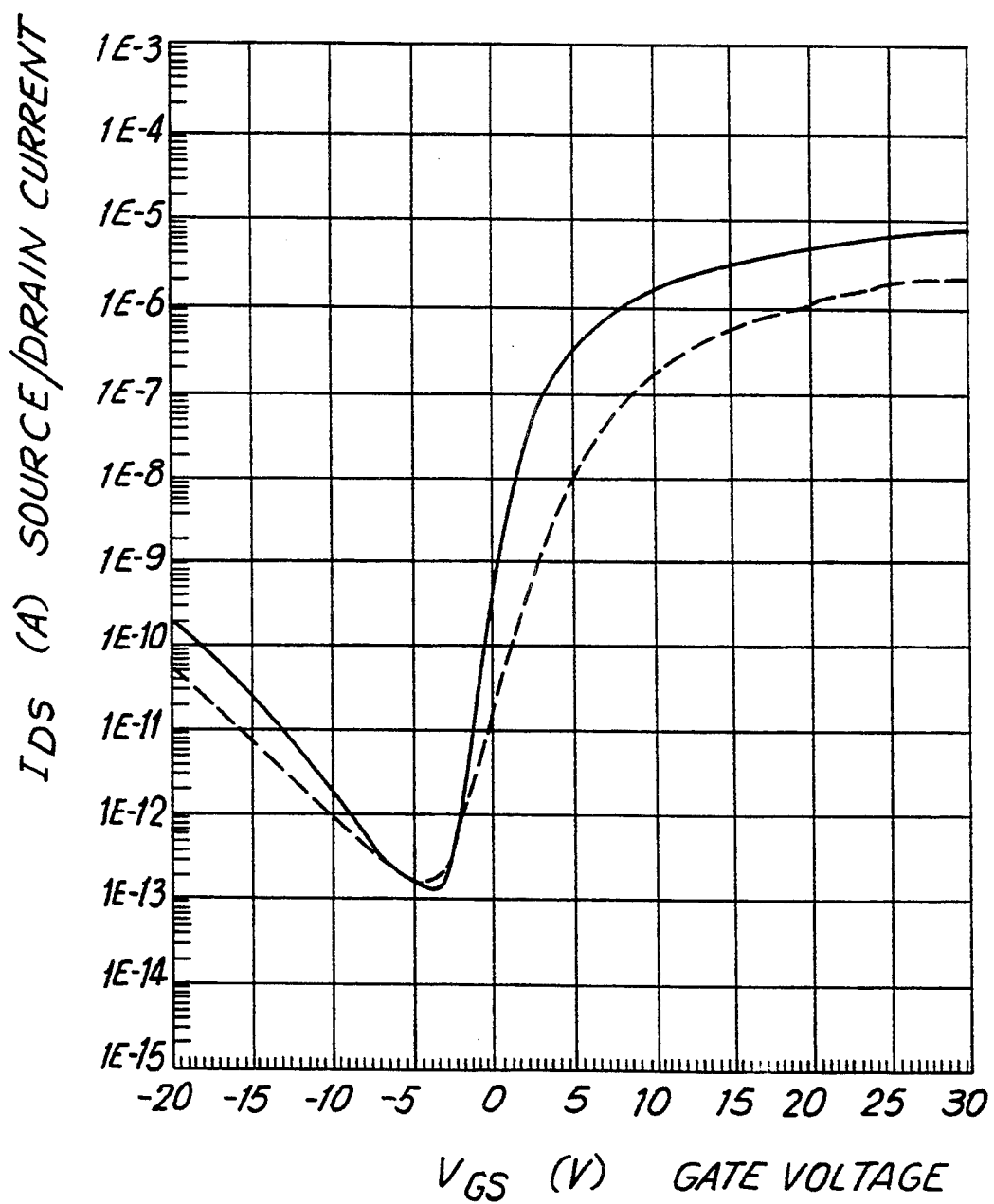
FIG. 2 is a graph comparing the change of source-drain current with gate voltage for a thin film transistor constructed in accordance with the invention to that of a thin film transistor constructed by a conventional method.

FIG. 2 shows the relationship between source/drain current and gate voltage. The solid line represents the gate voltage-transistor current ($V_{GS}$–$I_{DS}$) curve of a thin film transistor formed in accordance with the LPCVD method of Example 1 and the broken line is for a transistor prepared in a conventional manner. The characteristics of the transistor were measured at a source/drain voltage of $V_{DS}=4$ V and a temperature of 25° C. The channel portion of the transistor had a length L of 10 μm and a width W of 10 μm.

The ON current $I_{DS}$ flowing when the transistor was turned on was 1.32 μA for $V_{DS}=4$ V and $V_{GS}=10$ V. The OFF current at the minimum $I_{DS}$ was 0.12 pA at $V_{DS}=4$ V and $V_{GS}=-3.5$ V. The thin film transistor had good characteristics and an ON/OFF ratio of greater than 7 orders of magnitude. The effective electron mobility obtained from the saturation current region of the transistor was 3.9 cm²/v.s.

EXAMPLE 2

For Comparison

A thin film transistor was formed by the same method described in Example 1, except for the step of depositing thin film channel portion 105. The deposition temperature was 630° C. and it took 1½ hours to reach this temperature. Helium having a purity of 99.9999% flowed continuously passed at 350 SCCM during the temperature rise. A 250 Å thick silicon thin film was deposited at 630° C. and a silane flow rate of 150 SCCM, without any dilution gas. The pressure in the reactor was 49.2 mTorr during deposition and the partial pressure of silane (estimated by using helium in place of silane) was 39.7 mTorr. The silicon thin film was deposited at a rate of 73.4 Å per minute.

The broken line in FIG. 2 is the $V_{GS}$–$I_{DS}$ characteristic curve of this thin film transistor of Example 2. The size of the transistor and the measurement conditions were the same as those for the solid curve Example 1. The ON current ($I_{DS}$) was 0.12 μA, the OFF current ($I_{DS}$) was 0.15 pA and the ON/OFF ratio was less than 6 orders of magnitude. The effective electron mobility determined from the saturation current region of the transistor was 2.4 cm²/v.s.

A transistor will tend to have better characteristics when the silicon thin film channel layer is formed at a temperature of 630° C. or more, compared to a channel layer deposited at 600° C. or less. However, a comparison of the thin film transistors formed as in Example 1 and comparison Example 2, shows that when the thin film channel layer is deposited at a total reactor pressure of 8.54 mTorr and a silane partial pressure of 5.4 mTorr in a low pressure CVD process, the resulting thin film transistor will have characteristics that are better than a thin film transistor in which the channel region was deposited at 630° C. Accordingly, the low pressure CVD method provides improved results at a lower temperature.

EXAMPLE 3

A thin film transistor was formed as in Example 1, except that the thin film channel portion was deposited differently. The deposition temperature was 600° C., the time for increasing the temperature was 1 hour and helium having a purity of 99.9999% was continuously passed at 350 SCCM during temperature rise. However, channel portion 105 was deposited at silane flow rates of from 10 to 70 SCCM at 15 SCCM intervals to form sample Nos. 3-1 to 3-5 set forth in Table 1 below. The thickness of the channel regions used for thin film transistors was 250 Å.

Figure 3:
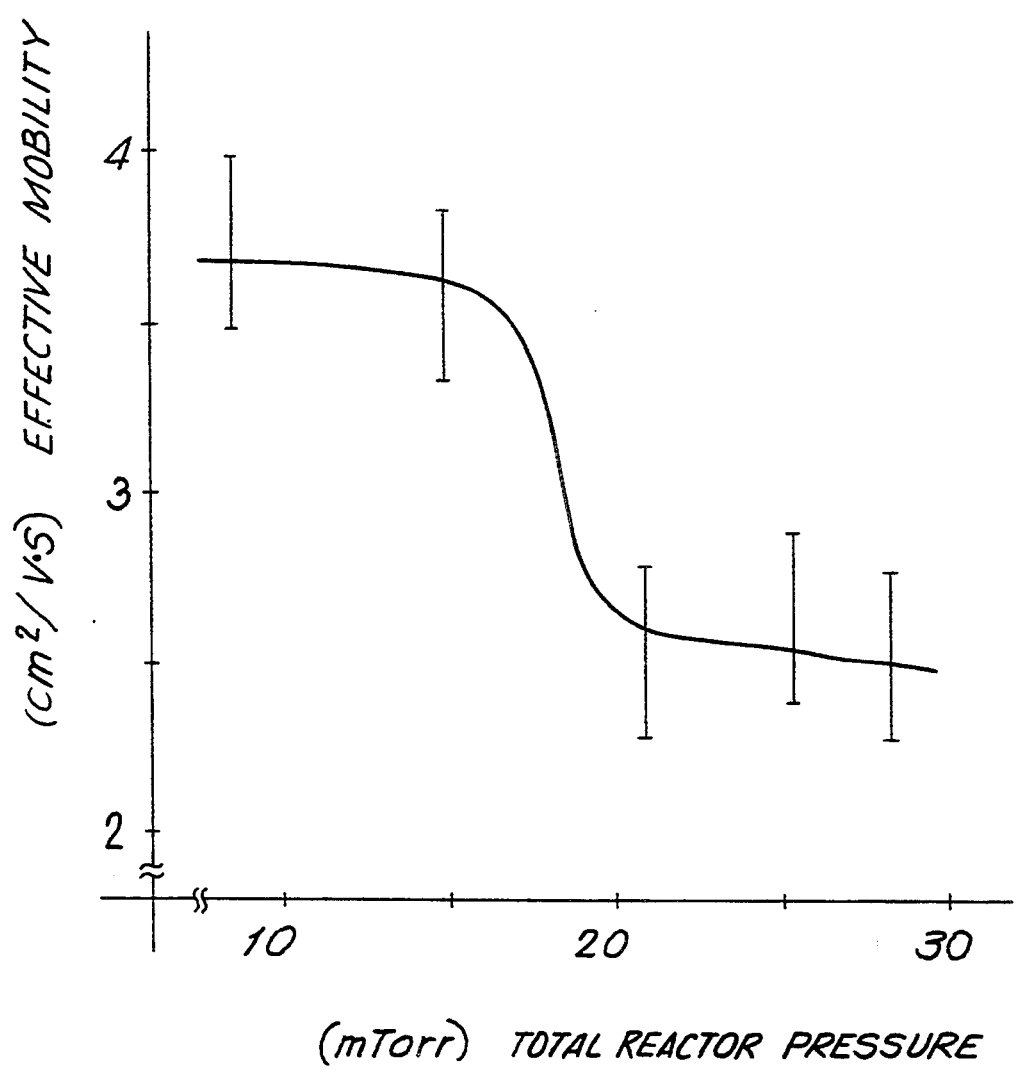
FIG. 3 is a graph showing the change of effective mobility with total reactor pressure for a thin film transistor constructed in accordance with the invention.

FIG. 3 shows the change in effective mobility with total reactor pressure. The effective mobility is determined from the saturation current region of thin film transistors 100 as a function of the pressure in the reactor during film formation. The error intervals are estimations based on a 95% confidence level. As shown in Table I and FIG. 3, when the pressure in the reactor is 15 mTorr or less, or the silane pressure is 10 mTorr or less, as in sample Nos. 3-4 or 3-5, the effective mobility can be improved by 40% or more and a thin film transistor having good characteristics can be contained.

TABLE 1

| Sample No. Silane Flow Rate (SCCM) | Pressure in Reactor (mTorr) | Silane Partial Pressure (mTorr) | Deposition Rate (Å/min) | Effective Mobility (cm²/v.s.) |
|---|---|---|---|---|
| 3-1 | 28.4 | 24.0 | 35.6 | 2.52 |
| 70 SCCM | ±0.8 | ±1.3 | ±0.3 | ±0.25 |
| 3-2 | 25.4 | 19.3 | 32.4 | 2.62 |
| 55 SCCM | ±0.8 | ±1.3 | ±0.3 | ±0.25 |
| 3-3 | 21.1 | 14.7 | 28.5 | 2.52 |
| 40 SCCM | ±0.8 | ±1.3 | ±0.3 | ±0.25 |
| 3-4 | 15.0 | 10.0 | 22.4 | 3.57 |
| 25 SCCM | ±0.8 | ±1.3 | ±0.3 | ±0.25 |
| 3-5 | 8.5 | 5.4 | 14.3 | 3.73 |
| 10 SCCM | ±0.8 | ±1.3 | ±0.3 | ±0.25 |

EXAMPLE 4

A thin film transistor was formed by the process of Example 1, except that thin film silicon channel portion 105 was deposited differently. The deposition temperature was 600° C., it took 1 hour to increase the temperature in the reactor to this level and helium having a purity of more than 99.9999% was continuously passed at 350 SCCM during temperature rise. A 250 Å thick silicon thin film channel portion was deposited by using silane at 40 SCCM diluted with helium at 710 SCCM. During the deposition the total pressure in the reactor was 146.4 mTorr. However, the silane partial pressure calculated using Dalton's law of partial pressure was 7.81 mTorr and the deposition rate was 24.7 Å per minute. The effective electron mobility determined from the saturation current region on the thin film transistor was 3.77 cm²/v.s.

A comparison of sample 3-3 of Example 3 with the thin film transistor of Example 4 shows that when the silane partial pressure is 10 mTorr or less, the effective mobility is improved by about 50% even when the total pressure in the reactor is 15 mTorr or more and a transistor having good characteristics can be obtained.

EXAMPLE 5

A silicon dioxide underlayer was formed on a 1.2 mm thick quartz glass substrate having a diameter of 75 mm. Another silicon dioxide film was formed on a single crystal silicon wafer having a <100> orientation. The silicon wafer was doped with phosphorus to yield an n-type semiconductor having a resistivity of 3.0 Ω·cm.

Both substrates were immersed in boiling 60% nitric acid for 5 minutes to remove contaminants from the surfaces thereof. The substrates were then immersed in a 5% hydrofluoric acid aqueous solution for 10 seconds to remove the nature oxide film on the surface of each substrate. Immediately after washing a 2000 Å thick silicon dioxide underlayer was deposited on the substrates by the APCVD process and the deposition conditions were the same as those for depositing the silicon dioxide underlayer film of Example 1.

The properties of an $SiO_2$ film formed by a CVD process are generally changed by heat treatment. Accordingly, each of the substrates was heated in a nitrogen atmosphere at 600° C. for 2 hours. Changes in properties of the $SiO_2$ underlayer will affect the properties of the silicon film disposed thereon.

The heat treatment to change the properties of the $SiO_2$ underlayer was intended to recreate the thermal history to which an $SiO_2$ underlayer is subjected, when the silicon thin film for the channel region is formed by the LPCVD method of Example 1. Channel portion silicon thin film 105 was deposited under the same conditions as in Examples 1 and 3.

Each of the substrates was then immersed in boiling nitric acid for 5 minutes and then in a 1.67 aqueous hydrofluoric acid solution for 20 seconds to clean the $SiO_2$ surface. During immersion, approximately 400 Å of the $SiO_2$ film was removed. Each of the substrates was then rinsed in pure water having nitrogen bubbled therein for 15 minutes and dried in a spin dryer. The silicon film was deposited on the $SiO_2$ underlayer film by the low pressure CVD process with the same apparatus as in Example 1.

For the sample in which a silicon wafer was used as the substrate, the silicon film was deposited under the same conditions as those used in Examples 3 and 4, i.e., the substrate was inserted in a reactor at a temperature of 395° C. to 400° C. and the temperature in the reactor was increased to a deposition temperature of 600° C. over a 1 hour period. During the temperature rise, the mechanical booster pump and the rotary pump were operated and helium having a purity of 99.9999% or more was passed at 350 SCCM.

The silicon film was deposited on the $SiO_2$ layer of the silicon wafer as in Example 3, i.e., the silane flow rate was set at intervals of 15 SCCM from 10 SCCM to 70 SCCM and dilution gas was not used. The conditions of Example 4 were also followed, i.e., silane at 40 SCCM, diluted with helium at 710 SCCM. The thickness of each of the deposited films was 250 Å.

For the sample having a quartz glass plate substrate, the silicon film was deposited under the same conditions as those for the silicon wafer substrate, except that the thickness of the deposited film and the method of increasing the temperature was different. When the quartz glass plate was used as the substrate, the thickness of the films deposited were 5000 Å±250 Å, 1000 Å±50 Å and 1370 Å±30 Å. Before each of the silicon films was deposited, the reactor temperature was increased to 600° C. from 400° C. while passing nitrogen having a purity of more than 99.99% at 900 SCCM and keeping the pressure in the reactor at about 160 mTorr.

The crystallographic orientation in a direction perpendicular to the substrate surface for each of the silicon thin films was examined by X-ray diffraction. The volume ratio of orientation in each of the directions was determined from the measured X-ray diffraction intensities and compared to the diffraction intensity ratio of a silicon powder which is completely randomly oriented and the plane anisotropy is compared. The thickness of the films for this measurement was 5000 Å±250 Å.

The crystallinity of a sample of the silicon thin film having a thickness of 1000 Å±50 Å was evaluated by laser Raman spectroscopy. The crystallinity of samples of silicon thin films having a thickness of 1370 Å±30 Å and 250 Å (respectively) was evaluated by multi-wavelength polarization analysis (multi-wavelength spectroscopic ellipsometry, MOSS-ES4G produced by Sopra Co., Ltd. of France).

When performing the laser Raman spectroscopy, scanning was performed in the region of wave numbers from 830 $cm^{-1}$ to 108 $cm^{-1}$. Crystallinity was determined from the relative ratio between the Raman scattering integrated intensity Ic at about 520 $cm^{-1}$ which is an optical mode frequency corresponding to crystal silicon and the sum Ia of scattering integrated intensities of amorphous silicon including acoustic transverse wave mode (TA) at about 130 $cm^{-1}$, acoustic longitudinal wave mode (LA) at about 290 $cm^{-1}$, optical longitudinal wave mode (LO) at about 405 $cm^{-1}$ and optical transverse wave mode (TO) at about 480 $cm^{-1}$, which are frequencies corresponding to amorphous silicon. (See, Appl. Pys. Lett., 40(6), 534 (1982)). Crystallinity was determined from the ratio of Ic to Ia. $IC = I_{TA} + I_{LA} + I_{TO} + I_{LO}$.

Crystallinity P was calculated by the following equations:

$$P = \frac{\sigma}{\sigma + K(1 - \sigma)}$$

$$\sigma = Ic/(Ic + Ia)$$

K represents a correction factor for scattering integrated intensity and was assigned a value of 0.88.

Multi-wavelength ellipsometry scanning was performed with a rotary polarizer and a wavelength range of from 250 nm to 850 nm. The incident angle was 70°. The spectra of tan $\Psi$ and cos $\Delta$ were obtained. The existing spectra of amorphous silicon and crystal silicon were combined at a desired volume ratio of amorphous to crystal silicon in accordance with BRUGGEMAN's formula (D. A. G. BRUGGEMAN, Ann, Phys., (Leipzig) 24, 636 (1935)). BRUGGEMAN's formula concerns the combination of complex indices of refraction. The crystallinity of the silicon layer was determined at a mixing ratio by volume at which the resultant spectra were in best agreement with the measured spectra.

Figure 4:
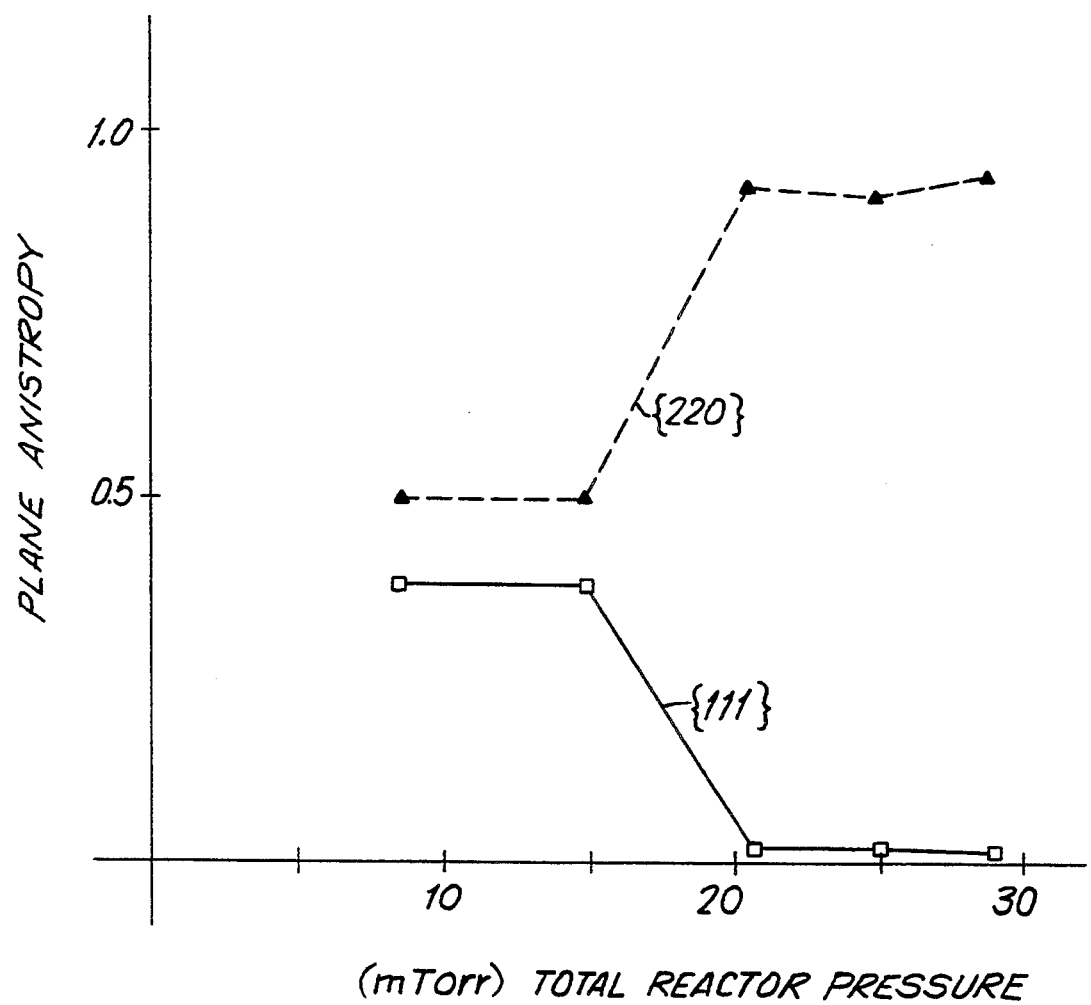
FIG. 4 is a graph showing the change of plane anisotropy with total reactor pressure for a silicon thin film formed in accordance with the invention.

FIG. 4 is a graph illustrating the relationship between the total pressure in the reactor during film formation and the plane anisotropy of the silicon thin film obtained by the LPCVD process. The only change for the various samples was to change the flow rate of silane from 10 SCCM to 70 SCCM and this resulted in the different pressures in the reactor, as shown in FIG. 4. The {220} plane showed essentially complete reflection when formed at a total reactor pressure of more than about 20 mTorr. Reflection from the {111} plane became strong at a total pressure of about 15 mTorr or less.

The pressure in the reactor and the partial pressure of silane occurring with helium replacing silane, are shown above in Table 1. The silane partial pressure corresponding to a total reactor pressure of 15 mTorr at which the plane anisotropy is changed, is 10 mTorr. Another silicon thin film was deposited as described above, using silane flowing at 40 SCCM, diluted with helium at 710 SCCM. During deposition, the total pressure in the reactor was 146.4 mTorr and the silane partial pressure calculated by Dalton's law of partial pressure was 7.81 mTorr.

The plane anisotropy of this silicon thin film showed an orientation in the {111} plane of 0.279 and an orientation in the {220} plane of 0.646. Accordingly, orientation in the {111} plane can be increased by decreasing the silane partial pressure to 10 mTorr or less by dilution. For example, an orientation of 0.021 in the {111} plane was obtained when the film was deposited at a total reactor pressure of 21.1 mTorr and a silane flow rate of 40 SCCM, without any dilution, as shown in FIG. 4.

Figure 5:
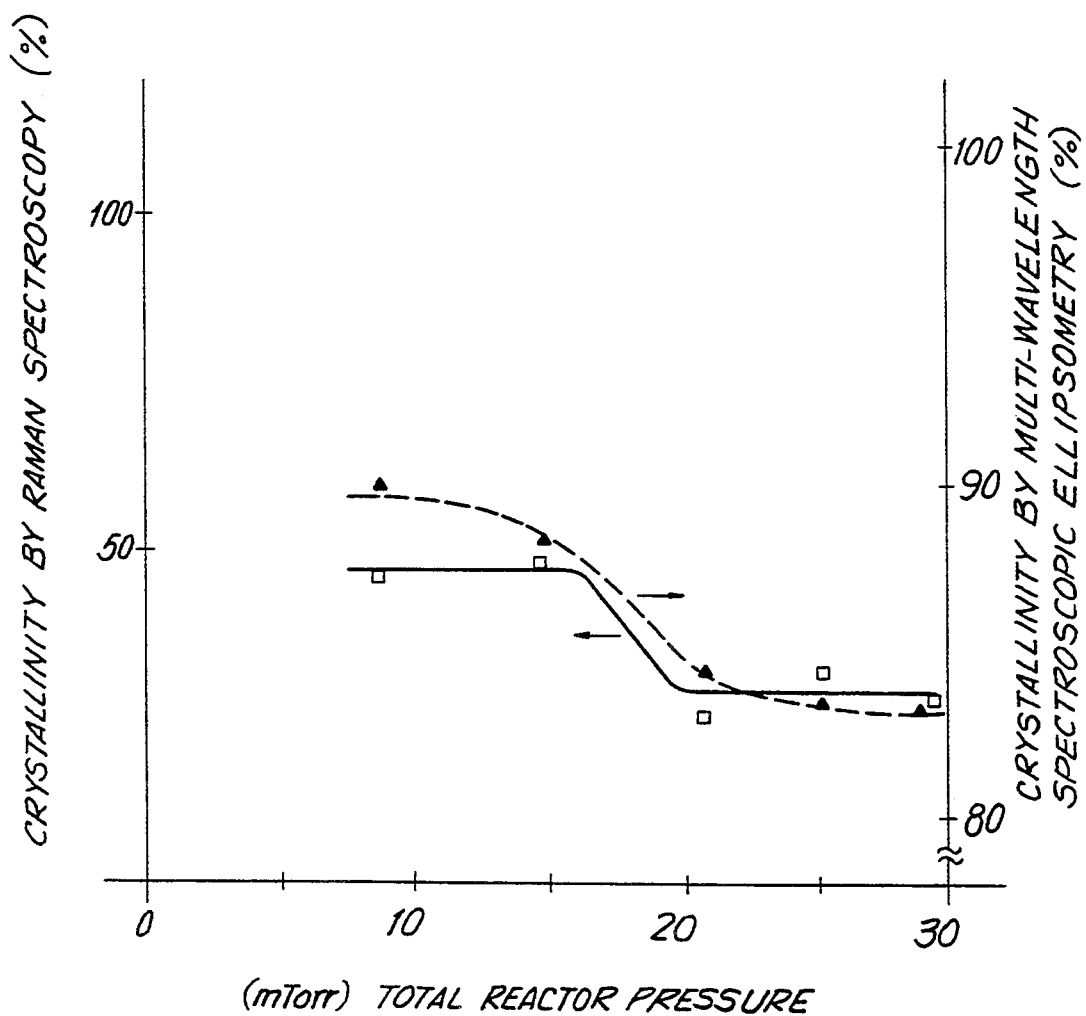
FIG. 5 is a graph showing the change in crystallinity (determined by Raman spectroscopy and by multi-wavelength spectroscopic ellipsometry) with total reactor pressure, for a silicon thin film formed in accordance with the invention.

FIG. 5 shows the degree of crystallinity of films formed at different reactor pressures. The crystallinity of the 1370 Å silicon film was measured by multi-wavelength spectroscopic ellipsometry and the crystallinity of a 1000 Å sample was measured by laser Raman spectroscopy. The values obtained are not in perfect agreement because both analyses involve different measurement principles, thicknesses and definitions of crystallinity.

However, both techniques show step-like changes in the region of a total reactor pressure of about 15 mTorr or a silane partial pressure of about 10 mTorr. When the film was produced by using silane flowing at 40 SCCM diluted with helium at 710 SCCM, having a silane partial pressure of 7.81 mTorr, the crystallinity measured by Raman spectroscopy was 41.0% and the crystallinity measured by multi-wavelength spectroscopic ellipsometry was 91.0%.

As shown in FIG. 5, decreasing the total reactor pressure to 15 mTorr or less or decreasing the silane partial pressure to 10 mTorr or less is effective for obtaining a silicon thin film having mainly {111} preferred orientation or high crystallinity when manufactured by the low pressure CVD process at a temperature of 600° C. or less.

The refractive index and extinction index of the 250 Å thick silicon thin film formed on the $SiO_2$ layer of the silicon wafer was measured by multi-wavelength spectroscopic ellipsometry (MOSS-ES4G, available from Sopra Co., Ltd. of France). These films were formed under the same conditions as in Examples 3 and 4. The interval estimation of the thickness including measurement error was 5.2 Å with a 95% confidence level. The properties of the 250 Å thick silicon thin film were compared to those of the other films.

Table 2 shows the refractive index of the 250 Å thick silicon film for light of 589.3 nm in air, light of 308 nm in air and the extinction index for light of 407.7 nm, all measured by multi-wavelength spectroscopic ellipsometry. Table 2 also shows the crystallinity of the 1000 Å thick silicon thin film, as measured by Raman spectroscopy and the effective mobilities for thin films of Examples 3 and 4, together with the total reactor pressure and the silane partial pressure for each of the samples.

As shown in Table 2, when a silicon film having a crystallinity of over 40% (Raman spectroscopy) is used as the channel portion of a thin film transistor, the effective mobility of the thin film shows marked improvement compared to thin films having a lesser degree of crystallinity. It was also discovered that when a silicon film having a refractive index of 4.06 or less for light having a wavelength of 489.3 nm in air, a refractive index of 4.46 or more for 308 nm light in air or having an extinction index of 0.81 or less for light of 404.7 nm is used in the channel portion of a semiconductor layer, the effective mobility is also improved, compared to silicon thin films characterized by a different refractive index or extinction index.

TABLE 2

| Source Gas Flow Rate During Silicon Deposition | Pressure in Reactor $P_{Total}$ (mTorr) | Silane Partial Pressure $PSiH_4$ (mTorr) | Effective Mobility $\mu$ (cm²/v.s.) | Crystallinity by Raman Spectroscopy (%) | Refractive Index in Air 589.3 nm N | Refractive Index in Air 308 nm N | Extinction Index for Light of 404.7 nm K |
|---|---|---|---|---|---|---|---|
| $SiH_4$ 70 SCCM | 28.4 ±0.8 | 24.0 ±1.3 | 2.52 ±0.25 | 27.8 | 4.202 | 4.300 | 1.066 |
| $SiH_4$ 55 SCCM | 25.4 ±0.8 | 19.3 ±1.3 | 2.62 ±0.25 | 33.6 | 4.192 | 4.310 | 1.047 |
| $SiH_4$ 40 SCCM | 21.1 ±0.8 | 14.7 ±1.3 | 2.52 ±0.25 | 24.6 | 4.173 | 4.336 | 1.010 |
| $SiH_4$ 25 SCCM | 15.0 ±0.8 | 10.0 ±1.3 | 3.57 ±.25 | 46.7 | 4.059 | 4.463 | 0.808 |
| $SiH_4$ 10 SCCM | 8.5 ±0.8 | 5.4 ±1.3 | 3.73 ±0.25 | 44.6 | 4.013 | 4.503 | 0.734 |
| $SiH_4$ 40 SCCM He 710 SCCM | 146.4 ±3.8 | 7.81 ±0.20 | 3.77 ±0.25 | 41.0 | 4.059 | 4.557 | 0.744 |

A thin film semiconductor device prepared in accordance with the invention includes a substrate covered with an insulating material having a silicon film thereon to serve as an active layer. The effective mobility of the active layer is improved by manufacturing the active layer in a specified manner. The film can be characterized by specified crystallinity and optical characteristics. When a silicon film is deposited by a low pressure CVD process in which the total pressure in the reactor is 15 mTorr or less or the silane partial pressure in the reactor is 10 mTorr or less, a good silicon film having {111} preferred orientation can be formed. The method of the invention enables production of thin film semiconductor devices having good transistor characteristics and is well-suited for making multi-layer LSI's and integrated devices to increase the performance of an active matrix liquid crystal display in which a thin film transistor is used, as well as decreasing the cost of the active matrix panel.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method of forming a MOSFET thin film transistor including a thin film layer of silicon to serve as an active layer of a transistor, comprising the steps of:
   providing a substrate;
   placing the substrate into a reactor;
   depositing a thin film silicon layer having a thickness of less than about 1400 Å on the substrate in the reactor by chemical vapor deposition by flowing gas through the reactor at a speed of at least about 1.7 SCCM/mTorr and using monosilane ($SiH_4$) as a source gas at one of a total reactor pressure of about 15 mTorr or less and a silane partial pressure of about 10 mTorr or less.

2. The method of claim 1, wherein the temperature in the reactor, during silicon deposition, is about 600° C. or less during silicon deposition.

3. The method of claim 1, wherein the total reactor pressure is about 15 mTorr or less.

4. The method of claim 1, wherein the silane partial pressure is about 10 mTorr or less.

5. The method of claim 1, wherein the reaction conditions are controlled so that the silicon thin film formed has a refractive index of 4.06 or less for light having a wavelength of 589.3 nm in air, a refractive index of 4.46 or more for light having a wavelength of 308 nm in air and an extinction index of 0.81 or less for light having a wavelength of 404.7 nm.

6. The method of claim 1, wherein the reaction conditions are controlled so that the resulting silicon thin film has a degree of crystallinity of about 40% or more, when measured by Raman spectroscopy.

7. The method of claim 1, wherein the reactor conditions are controlled so that the silicon film has mainly {111} preferred orientation.

8. The method of claim 1, including depositing an underlayer of insulating material on the substrate and depositing the silicon layer on the underlayer.

9. The method of claim 1, wherein the monosilane gas in the reactor is pumped at about 1.7 SCCM/mTorr or more.

10. The method of claim 1, wherein the monosilane gas in the reactor is pumped at more than about 1.78 SCCM/mTorr.

* * * * *